(12) United States Patent
Michaelis

(10) Patent No.: US 11,227,977 B2
(45) Date of Patent: Jan. 18, 2022

(54) OPTOELECTRONIC SEMICONDUCTOR DEVICE

(71) Applicant: OSRAM Opto Semiconductors GmbH, Regensburg (DE)

(72) Inventor: Benjamin Michaelis, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 30 days.

(21) Appl. No.: 16/226,199

(22) Filed: Dec. 19, 2018

(65) Prior Publication Data

US 2019/0189852 A1 Jun. 20, 2019

(30) Foreign Application Priority Data

Dec. 20, 2017 (DE) ...................... 10 2017 130 757.5

(51) Int. Cl.

| H01L 33/38 | (2010.01) |
|---|---|
| H01L 33/30 | (2010.01) |
| H01L 33/40 | (2010.01) |
| H01L 33/44 | (2010.01) |
| H01L 33/20 | (2010.01) |
| H01L 33/42 | (2010.01) |
| H01L 33/14 | (2010.01) |

(Continued)

(52) U.S. Cl.
CPC .......... *H01L 33/382* (2013.01); *H01L 27/156* (2013.01); *H01L 33/14* (2013.01); *H01L 33/20* (2013.01); *H01L 33/30* (2013.01); *H01L 33/405* (2013.01); *H01L 33/42* (2013.01); *H01L 33/44* (2013.01); *H01L 33/0016* (2013.01); *H01L 33/38* (2013.01); *H01L 33/385* (2013.01)

(58) Field of Classification Search
CPC ....... H01L 33/382; H01L 33/44; H01L 33/42; H01L 33/40–405; H01L 33/20–24; H01L 33/36–387; H01L 33/30; H01L 33/14; H01L 27/156
See application file for complete search history.

(56) References Cited

U.S. PATENT DOCUMENTS 5,105,236 A * 4/1992 Hayakawa ............. B82Y 20/00
257/201
2003/0230754 A1* 12/2003 Steigerwald .......... H01L 33/382
257/91

(Continued)

FOREIGN PATENT DOCUMENTS

DE    10 2007 022 947 A1    10/2008
DE    10 2012 108 883 A1    3/2014

*Primary Examiner* — Vincent Wall
(74) *Attorney, Agent, or Firm* — DLA Piper LLP (US)

(57) ABSTRACT

An optoelectronic semiconductor device includes a semiconductor layer sequence having an active zone that generates radiation, a first electrode that supplies current directly to a bottom side of the semiconductor layer sequence, and a second electrode that supplies current and extends from the bottom side to a top side of the semiconductor layer sequence opposite the bottom side, wherein the second electrode includes at least one current distribution structure on the top side, and the current distribution structure is impermeable to the generated radiation and electrically connected in a plurality of contact regions to at least one further component of the second electrode and configured for lateral current distribution starting from the contact regions.

8 Claims, 11 Drawing Sheets

(51) Int. Cl.
*H01L 27/15* (2006.01)
*H01L 33/00* (2010.01)

(56) References Cited

U.S. PATENT DOCUMENTS

| | | | |
|---|---|---|---|
| 2007/0063215 A1* | 3/2007 | Kohda | H01S 5/0201 257/103 |
| 2009/0283787 A1* | 11/2009 | Donofrio | H01L 33/62 257/98 |
| 2010/0171135 A1* | 7/2010 | Engl | H01L 33/58 257/98 |
| 2012/0199860 A1 | 8/2012 | Hodota | |
| 2015/0236209 A1 | 8/2015 | Pfeuffer | |

* cited by examiner

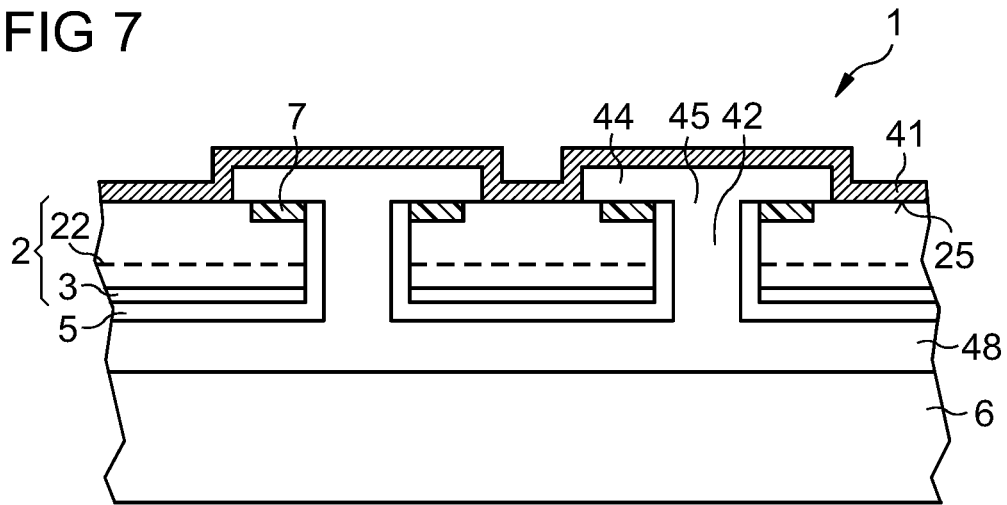
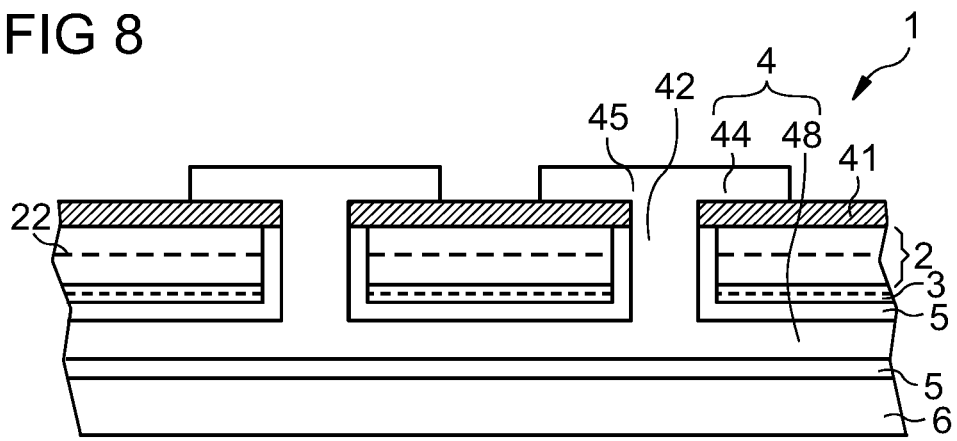
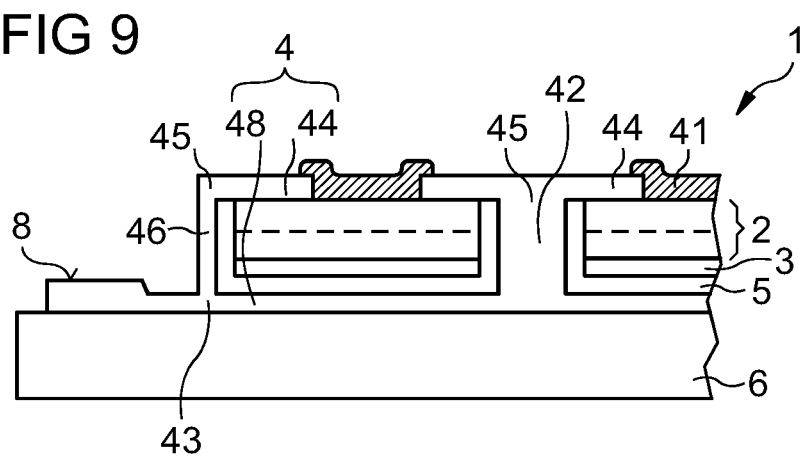

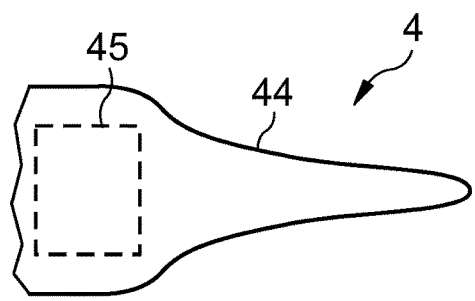
FIG 10A
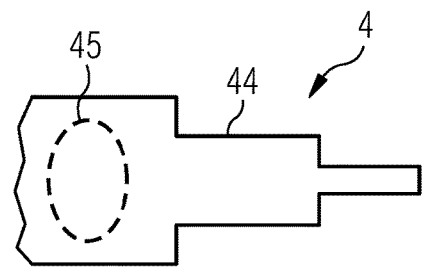
FIG 10B
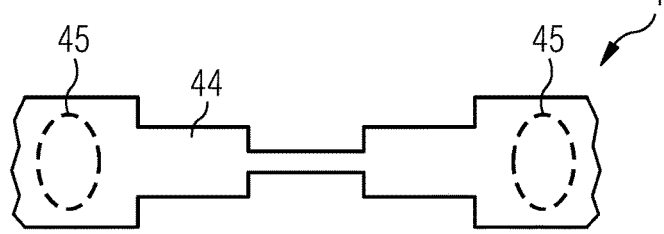
FIG 10C
FIG 11A
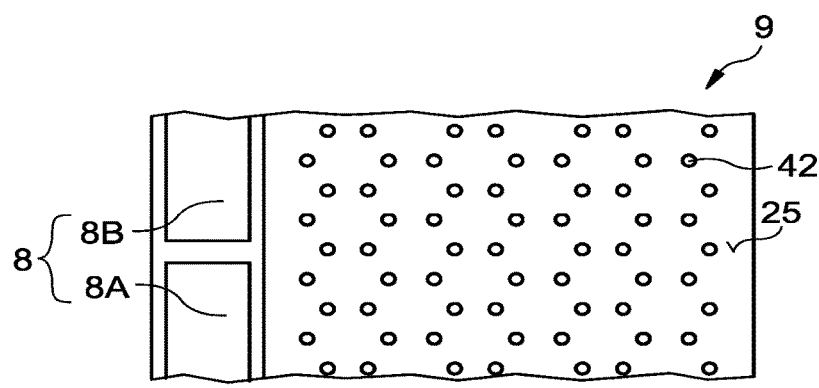
FIG 11B
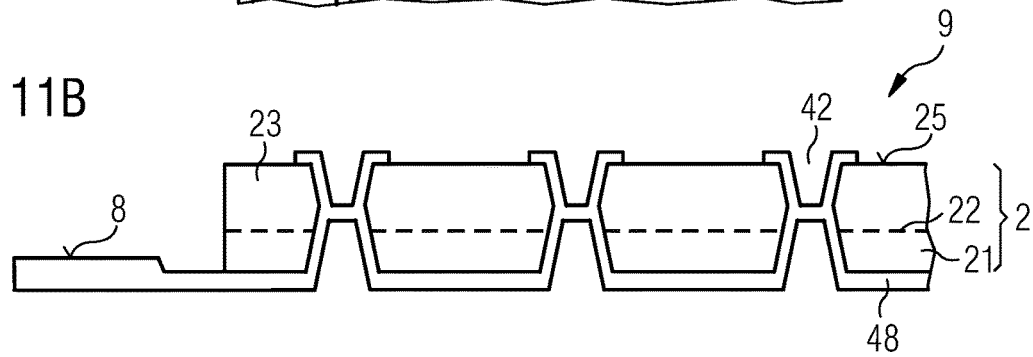

OPTOELECTRONIC SEMICONDUCTOR DEVICE

TECHNICAL FIELD

This disclosure relates to an optoelectronic semiconductor device.

BACKGROUND

There is a need to provide an optoelectronic semiconductor device having a high extraction efficiency.

SUMMARY

I provide an optoelectronic semiconductor device including a semiconductor layer sequence having an active zone that generates radiation, a first electrode that supplies current directly to a bottom side of the semiconductor layer sequence, and a second electrode that supplies current and extends from the bottom side to a top side of the semiconductor layer sequence opposite the bottom side, wherein the second electrode includes at least one current distribution structure on the top side, and the current distribution structure is impermeable to the generated radiation and electrically connected in a plurality of contact regions to at least one further component of the second electrode and configured for lateral current distribution starting from the contact regions.

I also provide a light-emitting diode including the optoelectronic semiconductor device including a semiconductor layer sequence having an active zone that generates radiation, a first electrode that supplies current directly to a bottom side of the semiconductor layer sequence, and a second electrode that supplies current and extends from the bottom side to a top side of the semiconductor layer sequence opposite the bottom side, wherein the second electrode includes at least one current distribution structure on the top side, and the current distribution structure is impermeable to the generated radiation and electrically connected in a plurality of contact regions to at least one further component of the second electrode and configured for lateral current distribution starting from the contact regions, wherein the semiconductor layer sequence is based on the material system AlGaInAsP, the first electrode is a mirror for radiation generated in operation so that emission of the radiation occurs at the top side and not at the bottom side, the second electrode includes a flat current spreading layer on a side remote from the semiconductor layer sequence, and the at least one current distribution structure is metallic.

BRIEF DESCRIPTION OF THE DRAWINGS

FIGS. 7 to 9 and 16 show schematic sectional views of examples of optoelectronic semiconductor devices.

FIGS. 10A to 10C, 14 and 15 show schematic top views of examples of current distribution structures for optoelectronic semiconductor devices.

FIGS. 11A to 13B show in parts A schematic top views and in parts B schematic sectional views of semiconductor devices.

Figure 1A:
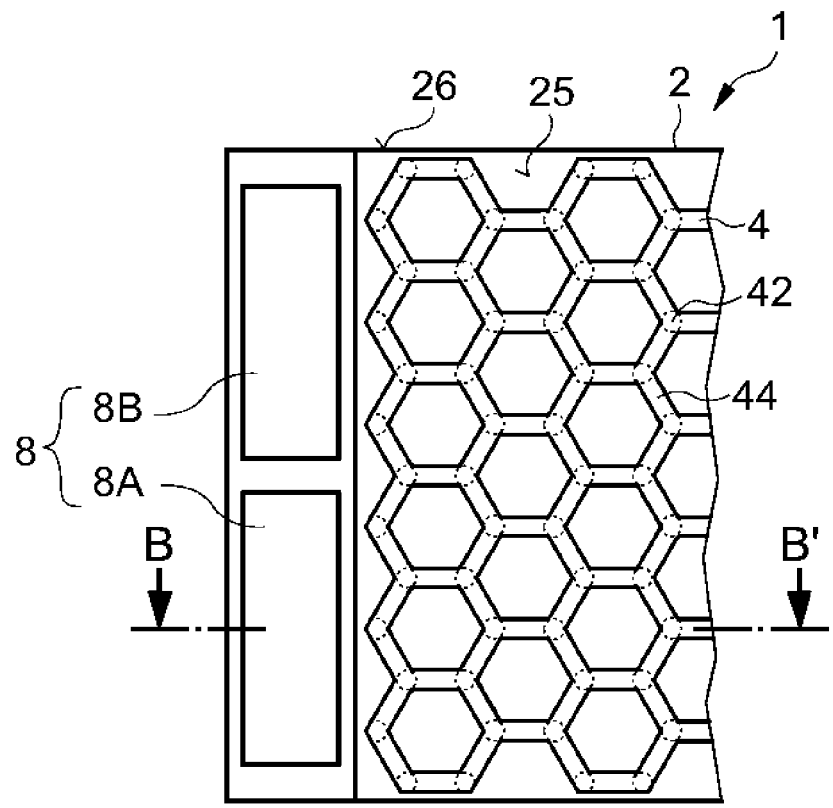
FIGS. 1A to 4B show in parts A schematic top views and in parts B schematic sectional views of examples of optoelectronic semiconductor devices.

LIST OF REFERENCE SIGNS 1 optoelectronic semiconductor device
2 semiconductor layer sequence
21 p-conducting region
22 active zone
23 n-conducting region
24 bottom side
25 top side
26 side face
3 first electrode
4 second electrode
41 current distribution layer
42 via
43 edge bar
44 current distribution structure
45 contact region
46 extension of the edge bar
47 cavity
48 current spreading layer
49 branching
5 electric insulation layer
6 carrier
7 electrical insulation
8A,8B electrical connection surfaces
9 modification of a semiconductor device
G growth direction of the semiconductor layer sequence

DETAILED DESCRIPTION

My optoelectronic semiconductor device may comprise a semiconductor layer sequence. The semiconductor layer sequence comprises at least one active zone that generates radiation. In particular, the active zone contains a pn-junction, a single quantum well structure or a multiple quantum well structure.

The semiconductor layer sequence is preferably based on a III-V compound semiconductor material. For example, the semiconductor material is a nitride compound semiconductor material such as $Al_n In_{1-n-m} Ga_m N$ or a phosphide compound semiconductor material such as $Al_n In_{1-n-m} Ga_m P$ or also an arsenide compound semiconductor material such as $Al_n In_{1-n-m} Ga_m As$ or such as $Al_n Ga_m In_{1-n-m} As_k P_{1-k}$, where in each case $0 \leq n \leq 1$, $0 \leq m \leq 1$ and $n+m \leq 1$ as well as $0 \leq k < 1$. Preferably, to at least one layer or to all layers of the semiconductor layer sequence the following holds true: $0 < n \leq 0.8$, $0.4 \leq m < 1$ and $n+m \leq 0.95$ as well as $0 < k \leq 0.5$. The semiconductor layer sequence may contain dopants and additional constituents. For the sake of simplicity, however, only the essential components of the crystal lattice of the semiconductor layer sequence, i.e. Al, As, Ga, In, N or P, are mentioned, even if they may be partially replaced and/or supplemented by small quantities of other substances.

The semiconductor layer sequence is particularly preferably based on the AlGaInAsP material system.

The semiconductor device may be a light emitting diode, or LED for short, or a light emitting diode chip, or LED chip for short. In this example, the semiconductor device generates incoherent radiation, in particular red light and/or near infrared radiation. Radiation generated by the active zone during operation, for example, has a wavelength of maximum intensity between 600 nm and 1100 nm. A main emission direction of the semiconductor device is preferably in the direction parallel to a growth direction of the semiconductor layer sequence.

The semiconductor device may comprise a first electrode. The first electrode impresses current directly on a bottom side of the semiconductor layer sequence. This means that the first electrode can predominantly or completely cover the bottom side of the semiconductor layer sequence. The first electrode is preferably a p-electrode.

The semiconductor device may comprise a second electrode. The second electrode supplies current to a top side of the semiconductor layer sequence opposite the bottom side. Preferably, the second electrode is an n-electrode.

The second electrode may extend from the bottom side to the top side. This means that the second electrode has components located on the bottom side or in a plane on the bottom side. The current is led from the bottom side towards the top side.

The second electrode may comprise one or more current distribution structures on the top side. The at least one current distribution structure is configured for lateral current distribution. Lateral means in particular in the direction transverse or perpendicular to the growth direction of the semiconductor layer sequence.

The current distribution structure may electrically connect in several contact regions to at least one further component of the second electrode. The other component may be a current supply for the current distribution structure such as an electrical via or an extension of an electrical edge bar. The contact regions, for example, are shaped point-like or line-like. A current distribution through the current distribution structure takes place starting from the contact regions away from these over at least parts of the top side of the semiconductor layer sequence.

The optoelectronic semiconductor device may comprise a semiconductor layer sequence having an active zone that generates radiation. A first electrode is used to energize the semiconductor layer sequence directly at a bottom side of the semiconductor layer sequence. A second electrode is configured to supply current to a top side of the semiconductor layer sequence opposite the bottom side and extends from the bottom side to the top side. On the top side, the second electrode comprises at least one current distribution structure that is opaque to the radiation, electrically connected in several contact regions to at least one further component of the second electrode and configured for lateral current distribution starting from the contact regions.

Especially in thin-film LEDs, where a growth substrate for the semiconductor layer sequence is removed, a current fed into a bond pad needs to be effectively fed into the active zone of the semiconductor layer sequence. For this purpose, both an n-side and a p-side need to be electrically contacted. The n-side is typically on the top side of the LED chip and normally contacted metallically. Metal on the top side, however, absorbs the photons generated and thus reduces the extraction efficiency of the radiation generated in the LED. Normally, the p-side can be connected simply at the bottom side of the chip.

Due to a limited electrical conductivity of the semiconductor layer sequence in the lateral direction, the current need to be brought sufficiently close to the active zone by additional structures such as the current distribution structure, especially along the lateral direction. With increasing distance to a bond pad as the electrical connection surface, typically positioned at a chip edge, the electrical resistance of the current supply lines increases so that conductor tracks need to be as wide as possible to minimize electrical losses. Thus, the metallic conductors need to have a sufficiently high cross section to transport the current and not cause degradation due to electromigration, which occurs when current densities are too high. With a uniformly energized chip area, the minimum required cross section of the conductor tracks is therefore highest directly at the bond pad and decreases with increasing distance from the bond pad.

My semiconductor device does not require a bond pad on the top side. A local current distribution on the top side of the semiconductor layer sequence takes place in connection with current feeds from the chip bottom side, where a connection to a laterally displaced located bond pad with an arbitrarily large area and cross section of the electrical conductor can be realized without light extraction losses.

In other LED chips, finger-shaped metal layers are applied to the top side of the chip that distribute the current from a bond pad over the chip. The contact fingers are relatively wide so that a comparatively large proportion of the chip surface is covered by metal to be able to conduct the current sufficiently and without risking aging of the current expansion due to electromigration.

Other chip designs use flat current expansions on a chip bottom side, thus avoiding shading of the chip top side. The current is distributed over the chip surface by hole feedthroughs, also known as vias or electrical through-holes. The hole feedthroughs are filled with metal. The hole feedthroughs typically end within the semiconductor layer sequence, which requires a comparatively high electrical transverse conductivity of the semiconductor layer sequence. This type of contacting is therefore essentially limited to blue emitting LED chips based on the AlInGaN material system.

For other chip designs, a bond pad can be attached to the top side in the center of the chip. However, a bond wire must also be led into the center, which leads to shading of parts of the chip.

Another possibility is to apply transparent conductive materials such as ITO to the chip. Due to the comparatively low absorption of such transparent conductive materials, light decoupling is not very strongly impaired. However, thick layers of such transparent conductive materials increase absorption, thin layers allow only a limited current density without causing aging of the chip. An electrical contact surface of the transparent conductive material to metallic conductors must also be sufficiently large to achieve sufficiently small contact resistances. Therefore, even when transparent conductive materials such as ITO are used, metallic conductors are usually required for current expansion, which contact the transparent conductive material at regular intervals distributed over the surface.

My semiconductor device combines via feedthroughs with a current distribution at the chip surface, whereby the electrical vias and the current distribution structure are preferably based on metals. The main current expansion, especially on the n-side, occurs in large area and cross section on the bottom side of the semiconductor layer sequence. Current leads extend from the bottom side to the top side and are formed, for example, by electrical vias or run along side faces of the semiconductor layer sequence to the top side. In addition, a local current distribution takes place on the top side by the current distribution structures configured, for example, in the form of branches like tree roots. The current distribution structures distribute the current away from the contact regions at the vias or on the side faces and lead the current over the top side. This means that the electrical vias are primarily designed for current transport to the top side and not current distribution over the chip surface.

Thus, a distance between adjacent vias can be increased in the semiconductor device, which leads to fewer losses in the active zone. Furthermore, a cross section of the vias can be reduced since no large electrical contact area of the vias to the semiconductor layer sequence is required, which in turn leads to less losses in the active zone. Shadowing effects can be reduced since smaller conductor cross sections at the chip top side are required for the current distribution structures since the current is efficiently conducted to the chip top side at several electrical contact regions.

Preferred are vias beyond the current distribution structure so that a smaller part of the active zone is shaded and fewer losses occur due to reabsorption. It is possible to achieve an increased contact surface with transparent conductive materials on the top side, which avoids aging of such materials due to otherwise too high current densities. It is also possible to connect several vias on the top side, which avoids chip area failure in the event of a defective via. In addition, easy surface scaling is possible without an increased bar width or additional bond pads. Finally, a reduced bar width can be achieved in high-current chips.

The first electrode may be a mirror for the radiation generated during operation. Thus, the radiation is emitted at the top side and not at the bottom side. It is possible that a small portion of the radiation is also emitted at the side faces of the semiconductor layer sequence. However, preferably a predominant proportion of the radiation of at least 70% or 80% or 90%, for example, is emitted at the top side.

The mirror formed by the first electrode can be a metallic mirror or a combination mirror. A combination mirror comprises a layer with a comparatively low refractive index transparent to the radiation, and a metal layer follows in the direction away from the semiconductor layer sequence. With a combination mirror, the radiation is reflected at small angles of incidence via total reflection and at large angles of incidence at the metallic layer. Alternatively, a Bragg mirror with electrically conductive layers can be provided for the first electrode.

The current distribution structure may be a metallic structure. This means that the current distribution structure has one or more metal layers. In particular, the current distribution structure consists exclusively of one or more metallic layers. A thickness or mean thickness of the current distribution structure shall in particular be at least 1 µm or 2 µm or 3 µm and at most 10 µm or 5 µm. For example, the average thickness of the current distribution structure is at least 30% or 50% of a thickness of the semiconductor layer sequence.

The current distribution structure may be impermeable to the radiation generated during operation. This means that no radiation generated during operation can pass through the current distribution structure and emerge from the semiconductor device.

The second electrode may comprise as a further component a plurality of electrical vias through the first electrode and through the semiconductor layer sequence. It is possible that the current distribution structure is electrically connected only by the vias, apart from an electrical contact to the semiconductor layer sequence.

The vias may be surrounded by a material of the semiconductor layer sequence in top view onto the top side. This means that the vias are located inside the top side when viewed from above.

At least one current distribution structure may electrically connect directly to the vias in the contact regions. It is possible that the vias or parts of the vias are integrally designed with the current distribution structure, e.g. are applied in a common metallization step and/or have the same material composition and/or layer sequence.

Several, or even all, of the vias may electrically directly connect to each other by one or more current distribution structures. For example, there are several strip-shaped current distribution structures that connect the associated vias along the strip. Furthermore, it is possible that all vias electrically connect by exactly one, e.g. net-shaped, current distribution structure. The net-shaped structure, for example, is formed by a rectangular, square or hexagonal net, seen from above onto the top side.

Each of the vias may be assigned its own current distribution structure. This means that there can be a one-to-one mapping between the vias and the current distribution structures.

The at least one current distribution structure, viewed from above, may extend away from the at least one associated via in a star-shaped and/or root-shaped and/or monotonically or strictly monotonically tapering manner. Root-shaped means in particular that a cross-sectional area and/or an area in plan view of the current distribution structure decreases monotonously or strictly monotonously in the direction away from the associated via.

The at least one current distribution structure may comprise one or more branches in the direction away from the associated vias and/or edge bars. This applies in particular to star-shaped current distribution structures directly at the respective via. This allows the current distribution structure to be distributed root-like with ever smaller cable cross sections. This allows a particularly large area of the semiconductor layer sequence to be uniformly energized by the current distribution structure with a low degree of coverage of the top side.

The vias may have an average diameter of at least 0.5 µm or 1 µm when viewed from above. Alternatively or additionally, the diameter of the vias in plan view is at most 12 µm or 8 µm or 5 µm. This means that the vias are comparatively small. The mean diameter is in particular a mean diameter of an opening in the semiconductor layer sequence, where a material for the corresponding via is introduced into this opening.

A mean protrusion of the current distribution structure beyond the associated via in the lateral direction, in particular in the direction perpendicular to the growth direction of the semiconductor layer sequence, may be at least three times or five times or ten times the mean diameter of the associated via. This means that a lateral spread of at least one current distribution structure is significantly larger than a spread of the vias.

An average distance between adjacent vias may be at least 50 µm or 100 µm. Alternatively or additionally, this distance is at most 400 µm or 200 µm or 150 µm. In other words, the vias can be comparatively far apart from one another.

The vias may narrow in cross section seen from the bottom side and/or from the top side towards a center of the semiconductor layer sequence. The narrowings on the bottom side and/or on the top can be of varying extent. In other words, the vias can be shaped like a symmetrical or asymmetrical sand glass when viewed in cross section.

The vias may have a cavity directly on the bottom side and/or on the top side. In the middle of the semiconductor layer sequence, seen along the growth direction, the vias are preferably closed, especially by a metal layer.

The vias may be completely covered by the at least one current distribution structure when viewed from above or located completely within the current distribution structure. For example, lying completely within the current distribution structure means that the respective via, seen from above onto the top side, is directly surrounded all around by a material of the current distribution structure.

The second electrode may comprise an edge bar as a further component. The edge bar partially or completely surrounds the semiconductor layer sequence in plan view, for example, to at least 60% or 80% or 90%. The contact regions to the current distribution structure are formed by the edge bar itself or extensions of the edge bar along side faces of the semiconductor layer sequence. This allows the current distribution structure to electrically connect to an outer boundary line of the top side in the form of a frame. In addition, there may be electrical through-connections.

The current distribution structure may extend from the contact regions, which are located at the edge of the top side, to an inner area of the top side in the form of a grid when viewed from above. In other words, starting from the edge where the contact regions are located, a net is stretched across the top side, formed by the current distribution structure. In this example it is possible that there are no vias.

A maximum distance between adjacent contact regions and/or between adjacent current distribution structures may be 150 µm or 100 µm or 80 µm or less. This preferentially means that no point on the top of the semiconductor layer sequence is farther spaced from the at least one current distribution structure than 75 µm or 50 µm or 40 µm. This ensures a homogenous current supply to the active zone.

The at least one current distribution structure may taper in the direction away from the nearest contact region in plan view and/or its electrical conductor cross section decreases. This allows the cable cross section of the current distribution structure to be adapted to the locally led current. Thus, the degree of coverage of the top side with the current distribution structure can be minimized.

The second electrode may comprise a current distribution layer of a transparent conductive oxide. The current distribution layer preferably covers the top side areally, especially the entire top side or at least 80% or 90% of the top side.

The at least one current distribution structure may be located between the semiconductor layer sequence and the current distribution layer. This means that the current distribution layer can be placed on the current distribution structure.

The current distribution layer of the transparent conductive oxide, TCO for short, may be located at least in places between the semiconductor layer sequence and the at least one current distribution structure. In this example, the current distribution structure, which is metallic in particular, is attached after the current distribution layer is applied.

There may be an electrical insulation in places or over the entire top side between the semiconductor layer sequence and the at least one current distribution structure. This means in particular that there is no straight connection line between the current distribution structure and the semiconductor layer sequence that does not pass through the electrical insulation. This means that no current is impressed directly from the current distribution structure into the semiconductor layer sequence, but in particular only indirectly via the current distribution layer. Alternatively, it is possible that only 50% or 80% or less of this electrical isolation is applied between the current distribution structure and the semiconductor layer sequence.

Electrical connection surfaces for the first and second electrodes may be arranged in a common plane on the bottom side. The connection surfaces are set up for external electrical contacting of the semiconductor device and are designed, for example, as bond pads. Thus, it is possible that the top side of the semiconductor layer sequence is free of electrical connection surfaces.

The top side of the semiconductor layer sequence may be made of a semiconductor material. The semiconductor material of the top side is preferably directly covered by the second electrode, in particular by the current distribution structure. This means that the second electrode, for example, the current distribution structure, and the semiconductor material can touch each other.

In the following, my optoelectronic semiconductor devices are explained in more detail with reference to the drawings by examples. Same reference signs indicate the same elements in the individual figures. The relationships between the elements are not shown to scale, however, but rather individual elements may be shown exaggeratedly large to assist in understanding.

Figure 1B:
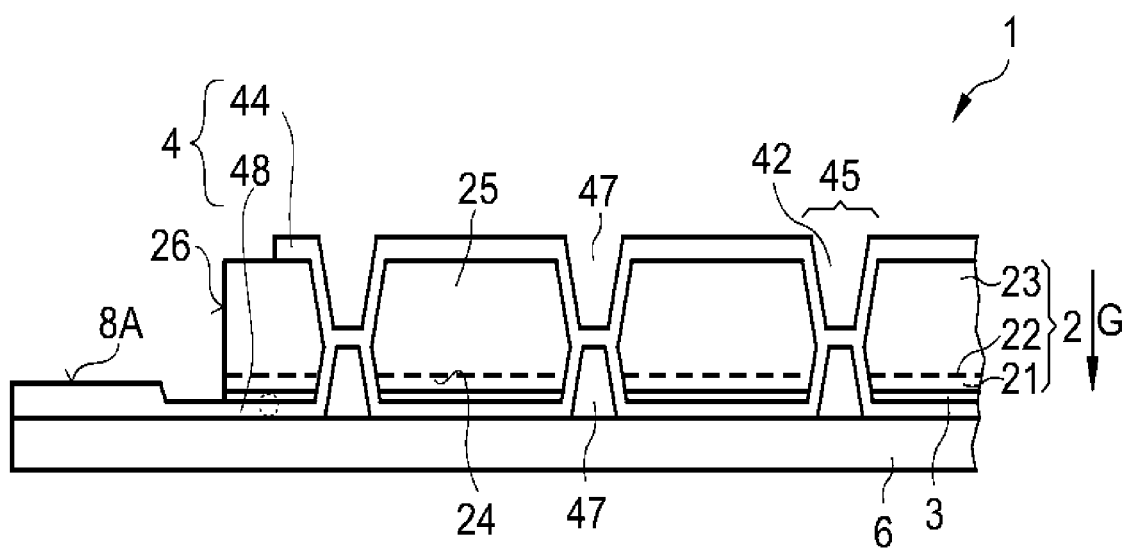
FIG. 1C shows an exploded schematic cross section of structure taken from FIG. 1B and an electrical insulation layer.

FIGS. 1A and 1B show an example of an optoelectronic semiconductor device 1. The semiconductor device 1 comprises a semiconductor layer sequence 2 with an active zone 22. The active zone 22 is located between a p-conducting region 21 and an n-conducting region 23. A growth direction G of the semiconductor layer sequence 2 extends from the n-type region 23 to the p-type region 21.

A first electrode 3 for direct current supply to the semiconductor layer sequence 2 is located flatly on the p-conducting region 21. From a bottom side 24 of the semiconductor layer sequence 2, on which the first electrode 3 is located, electrical vias 42 of a second electrode 4 extend towards a top side 25 on the n-conducting region 23. Optionally, the vias 42 each have a cavity 47 on the top side 25 and on the bottom side 24, but can alternatively also be completely filled. A metallization in the vias 42 is H-shaped in cross section, whereby the vias 42 taper on both sides in the direction of a center of the semiconductor layer sequence 2.

Figure 1C:
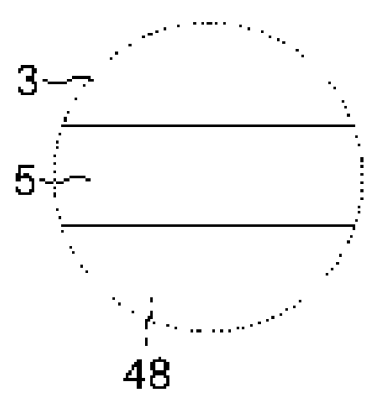

A flat current spreading layer 48 of the second electrode 4 is located on the bottom side 24. The current spreading layer 48 connects to an associated electrical connection surface 8. An areal current distribution for the second electrode 4 takes place along the bottom side 24 via the current spreading layer 48. FIG. 1C shows the electrical insulation layer 5 that is positioned between the first electrode and the second electrode.

On the top side 25, there is a current distribution structure 44 starting from the vias 42, which form contact regions 45 of the second electrode 4. Seen in top view onto the top side 25, the current distribution structure 44 of the second electrode 4 is formed by a hexagonal, continuous net. This enables uniform current impressing into the top side 25 of the semiconductor layer sequence 2. A mesh size of the net formed by the current distribution structure 44 is preferably not more than 100 µm.

The current distribution structure 44 is preferably designed as a single piece and composed of one or more metal layers. Furthermore, the current distribution structure 44 is opaque to radiation generated during operation in the active zone 22. A degree of coverage of the top side 25 with the current distribution structure 44 is comparatively low.

It is possible that the current distribution structure 44 does not reach side faces 26 of the semiconductor layer sequence. In addition, the current distribution structure 44 is optionally attached to a carrier 6. The carrier 6, for example, is made of a semiconductor material such as silicon or a thermally conductive material such as a ceramic. The carrier 6 can be electrically conductive. To simplify the illustration, electrical insulation layers between the electrodes 3, 4 and on the side walls of the vias 42 or towards the carrier 6 are not shown.

Viewed from above, the vias 42 are completely covered by the current distribution structure 44 or lie within the current distribution structure 44. Thus, no additional shading of the active zone 22 occurs due to the vias 42 compared to the current distribution structure 44.

Figure 2A:
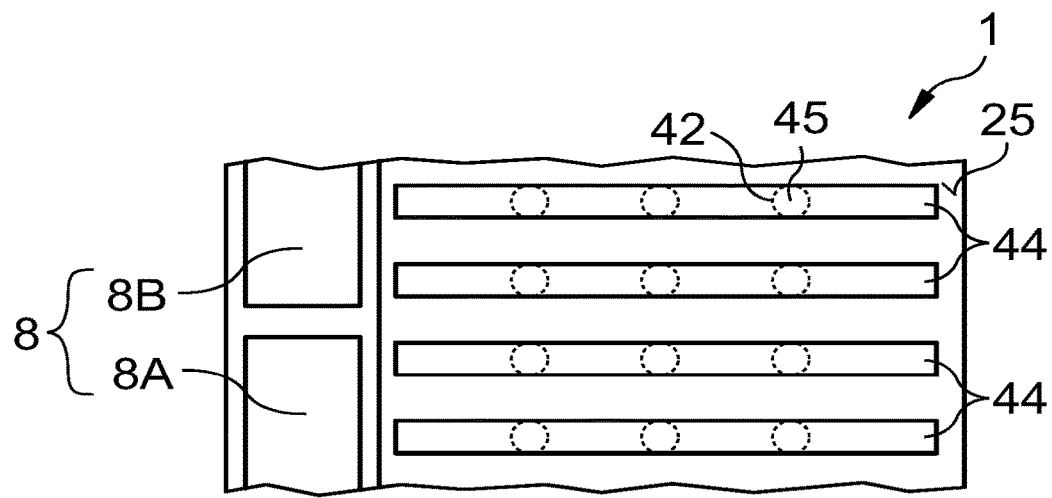
Figure 2B:
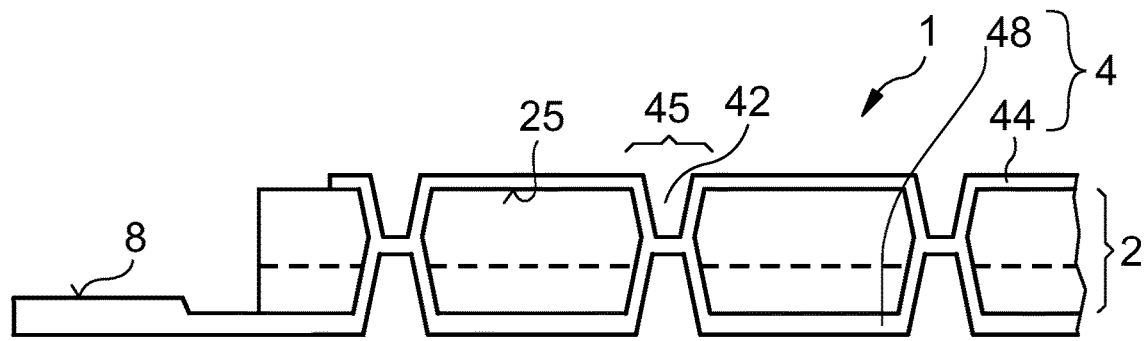

In the example of FIGS. 2A and 2B, the vias 42 are arranged in a square or rectangular grid. The multiple current distribution structures 44 are each of strip-shape and each extend in a straight line across several of the vias 42. Again, the current distribution structures 44 do not need to reach to an edge of the semiconductor layer sequence 2, although this may be the case in deviation from FIGS. 2A and 2B.

The electrical connection surfaces 8A,8B for the two electrodes 3, 4 are located in a common plane on the bottom side 24. This means that the top side 25 is free of the connection surfaces 8. The semiconductor device 2 can be electrically connected externally via the connection surfaces 8 using bond wires, for example. In all other respects, the remarks on FIGS. 1A and 1B apply accordingly.

Figure 3A:
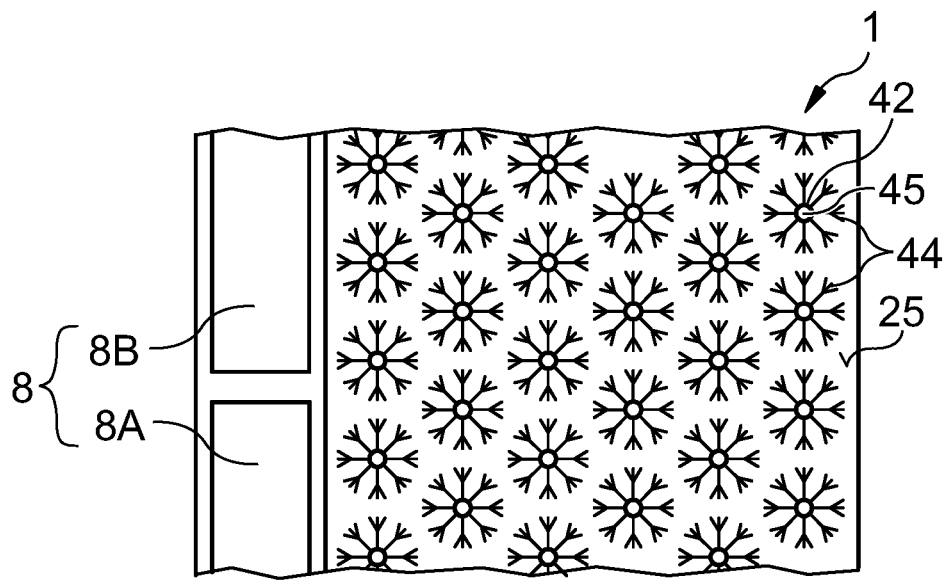
Figure 3B:
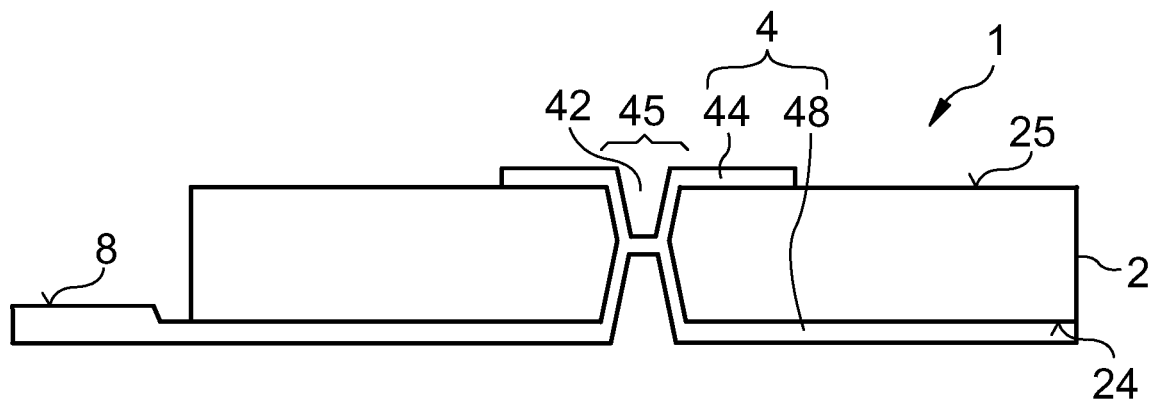

In the example of FIGS. 3A and 3B, the vias 42 are arranged in a hexagonal grid. Starting from each one of the vias 42, one of the current distribution structures 44 extends. Viewed from above, the current distribution structures 44 of the second electrode 4 are star-shaped, for example, as an eight-beam star. Optionally, the inner, star-shaped area can be further refined by branches 49 and can continue outwards away from the vias.

Further branches can be present on the outside of an inner star, resulting in a root-like structure that can taper monotonously in the direction away from the vias 42. A length of rays of the inner stars and of the outer branches is preferably the same in the radial direction, for example, with a tolerance of not more than 25%. From each of the vias 42, a comparatively large proportion of the active zone 22 can thus be energized via the associated current distribution structure 44. In all other respects, the remarks on FIGS. 1A and 1B apply accordingly.

Figure 4A:
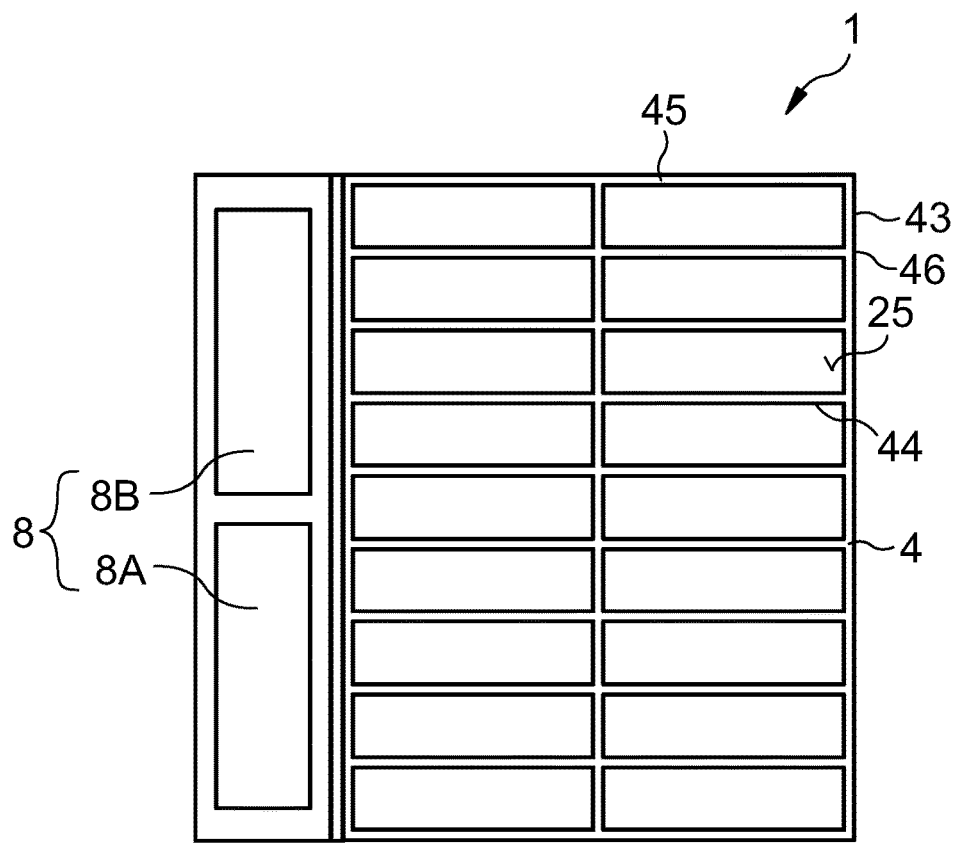
Figure 4B:
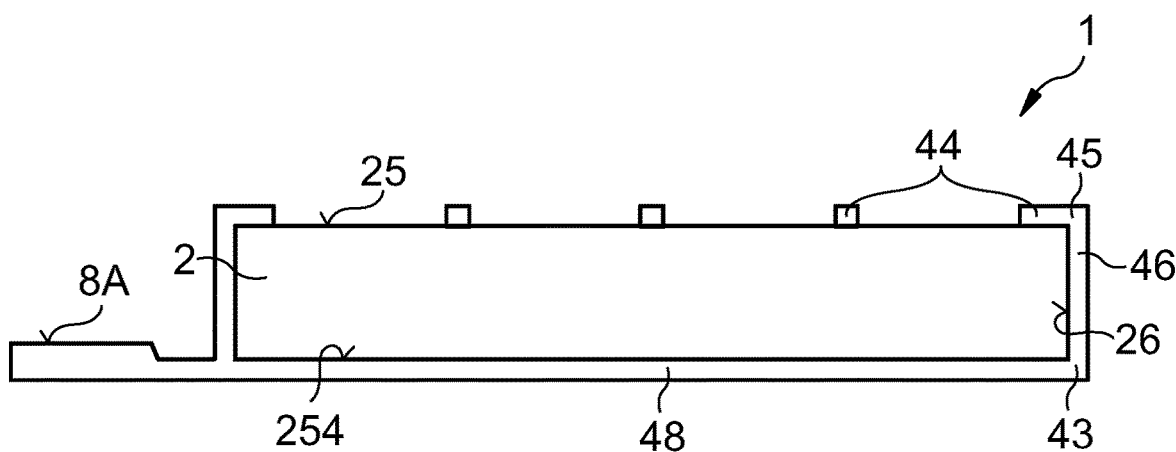

In the example shown in FIGS. 4A and 4B, the second electrode 4 has an edge bar 43 completely surrounding the semiconductor layer sequence 2. The edge bar 43 can be located in the same plane as the flat current spreading layer 48. On the side faces 26 of the semiconductor layer sequence 2, an extension 46 of the second electrode 4 extends from the edge bar 43 to the top side 25. The contact regions 45 each extend along one side edge of the semiconductor layer sequence 2 on the top side 25 so that the top side 25 is surrounded frame-like by a total of four of the contact regions 45 that are each shaped in a linear manner. The current distribution structure 44 also extends frame-like along the side edges of the top side 25.

Optionally, the current distribution structure 44 includes a grid structure extending into an interior area of the top side 25 and formed, for example, by a rectangular grid. For semiconductor layer sequences 2 with a small edge length of the top side 25 of 150 μm or 100 μm at the most, for example, this grid structure can be omitted.

To simplify the representation, the first electrode is not shown in FIGS. 4A and 4B, nor in FIGS. 2A, 2B, 3A and 3B.

Figure 5:
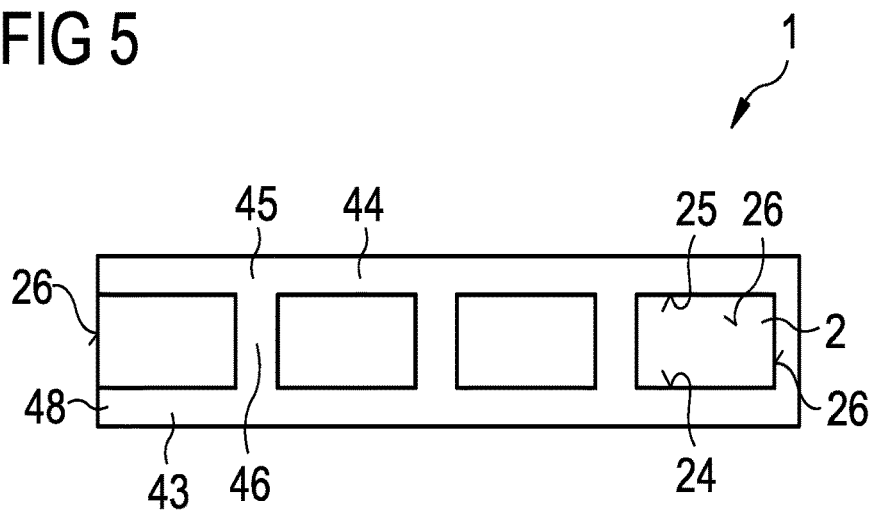
FIG. 5 shows a schematic side view of an example of an optoelectronic semiconductor device.

According to FIGS. 4A and 4B, the edge bar 43 and the extension 46 enclose the semiconductor layer sequence all around. On the other hand, FIG. 5 shows that the side faces 26 are only partially covered by the extensions 46. The current distribution structure 44, on the other hand, can form a complete frame around the top side 25.

It is possible that lateral edges of the side faces 26 are free of the extensions 46 as shown in FIG. 5, left side of the semiconductor layer sequence 2. Alternatively, these edges can also be provided with one of the extensions 46 as shown in FIG. 5, right side of the semiconductor layer sequence 2.

Figure 6:
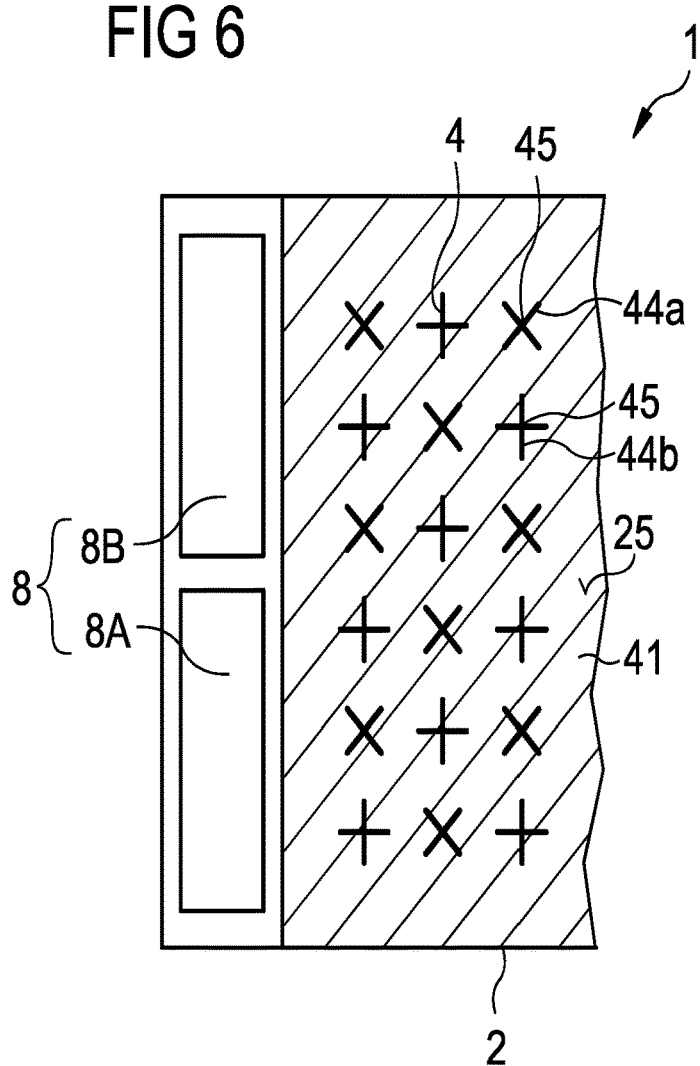
FIG. 6 shows a schematic top view of an example of an optoelectronic semiconductor device.

In the example of FIG. 6 it is shown that the second electrode 4 also has a current distribution layer 41. The current distribution layer 41 is transparent to the generated radiation and preferably is made of a transparent conductive oxide such as indium tin oxide, ITO for short. In particular, the current distribution layer 41 is applied over the entire surface of the semiconductor layer sequence 2. Such a current distribution layer 41 can also be present in the examples of FIGS. 1A to 5.

FIG. 6 also shows that two different types of current distribution structures 44a, 44b are present. The current distribution structures 44a, 44b can have the same basic geometric shape and, for example, can be rotated alternately by 45° against each other to achieve a low degree of coverage of the top side 25 with the current distribution structures 44a, 44b and to achieve a uniform current injection into the active zone 22. A mixture of different current distribution structures 44a, 44b is also possible in all examples.

FIG. 7 illustrates that the vias 42, starting from the current spreading layer 48, run through the first electrode 3 and through the entire semiconductor layer sequence 2 to the top side 25. To avoid electrical short circuits, the electrical insulation layer 5 is provided.

In addition, FIG. 7 shows that the current distribution layer 41 is applied over the entire surface and covers the current distribution structure 44 completely or, alternatively, only partially. A layer thickness of the current distribution structure 44 is preferably at least 10 nm or 20 nm and/or at most 100 nm or 70 nm. Due to the current distribution structures 44, the current distribution layer 41 can be comparatively thin since no extensive lateral current distribution with high current intensities has to take place by the current distribution layer 41.

Contrary to FIG. 7, the current distribution layer 41 can also be located between the current distribution structure 44 and the semiconductor layer sequence 2 as shown in FIG. 8.

FIG. 7 also illustrates that an electrical insulation 7 can be installed directly below the current distribution structure 44, in places or alternatively over the entire surface. Thus, it is possible to achieve that the active zone 22 is not energized directly below the current distribution structure 44 so that absorption losses at the current distribution structure 44 can be further reduced.

Deviating from the illustration in FIG. 7, the electrical insulation 7 is preferably fitted congruently with the current distribution structure 44 or slightly exceeds the current distribution structure 44 laterally, for example, by at least 0.5 μm and/or at most 3 μm. This allows an efficient current distribution into the current distribution layer 41 by the current distribution structure 44 with simultaneously minimized absorption at the current distribution structure 44.

FIG. 8 further shows that the first electrode 3 can be composed of several layers, for example, of a layer facing the semiconductor layer sequence 2, which is configured for total internal reflection of the generated radiation, and a metallic layer which is further away from the semiconductor layer sequence 2. Deviating from the illustration in FIG. 8, it is possible that through the layer of the first electrode, which is located closer to the semiconductor layer sequence 2, 3, breakthroughs are formed to lead the further layer of the first electrode 3 in places directly to the semiconductor layer sequence 2.

The current distribution layer 41 can cover the insulation layer 5 on the top side 25 or, deviating from FIG. 8, can terminate flush with the insulation layer 5 in the direction away from the active zone 22.

In the example of FIG. 9 it is shown that the current distribution layer 41 is substantially limited to areas adjacent to the current distribution structure 44. The current distribution structures 44 themselves are only partially covered by the current distribution layer 41.

Furthermore, FIG. 9 shows that the edge bars 43 together with the extensions 46 can be combined with the vias 42. The same applies to all other examples.

FIGS. 10A to 10C illustrate that the current distribution structure 44 can taper in the direction away from the associated contact region 45. This makes it possible to reduce the degree of coverage of the top side 25 with the current distribution structure 44.

The current distribution structure can continuously taper as shown in FIG. 10A. Alternatively, tapering can be carried out in stages as illustrated in FIG. 10B. Accordingly, several of the contact regions 45 can also be connected to each other in a stepwise or continuously tapering manner as shown in FIG. 10C.

In addition, FIGS. 10A to 10C show that the contact regions 45 themselves can be square or rectangular, seen in top view, compare FIG. 10A, or elliptical as shown in FIG. 10B. The contact regions 45 are preferred, however, of circular shape when viewed from above as illustrated in FIG. 10C. Such designs of contact regions 45 may also be present in all other implementation examples.

FIGS. 11A to 13B show variations 9 of semiconductor devices. According to FIGS. 11A and 11B, only vias 42 without any current distribution structure 44 are present. This means that a comparatively large number of 42 vias are required. In addition, a diameter of the vias 42 must be relatively large to ensure a sufficiently large electrical contact area to the semiconductor layer sequence 2 in the region of the n-conducting region 23.

Figure 12A:
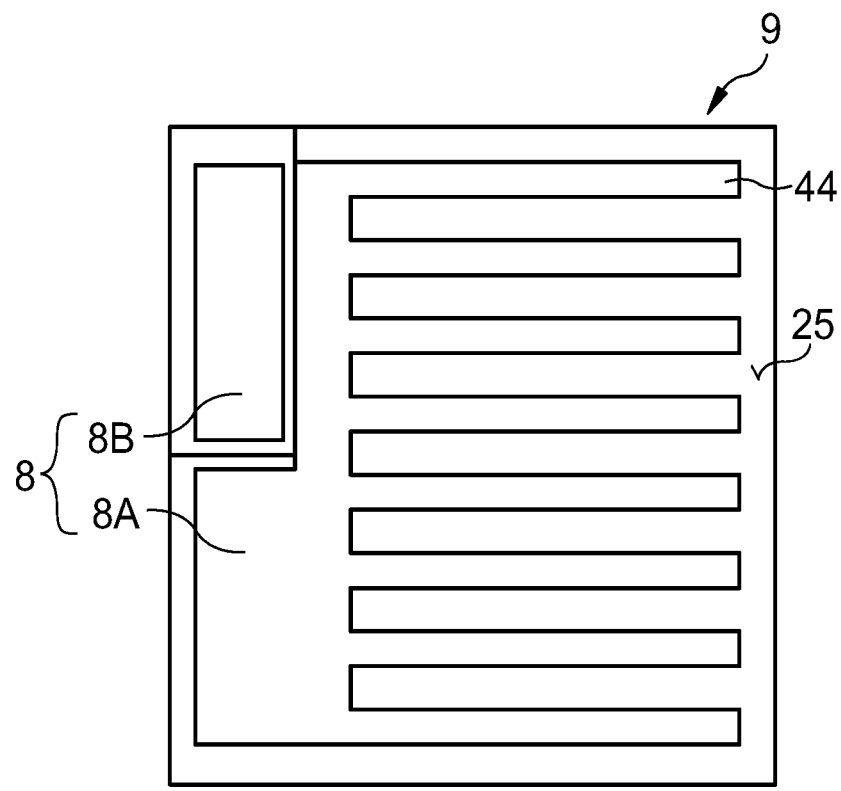
Figure 12B:
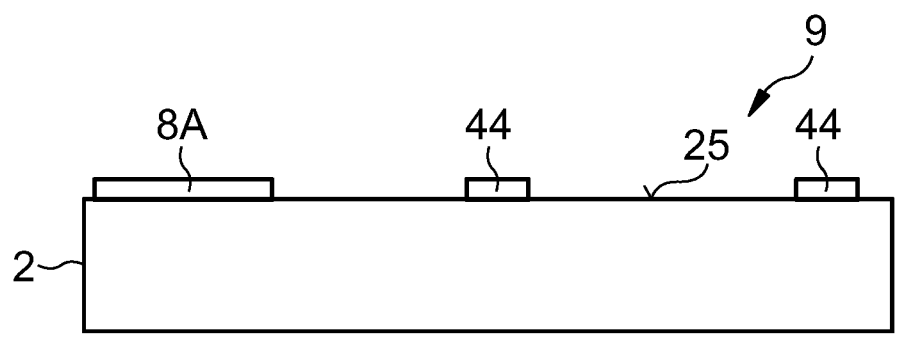

As shown in FIGS. 12A and 12B, the connection surface 8 for the second electrode 4 is located on the top side 25. Thus, a large part of the top side 25 is covered. Furthermore, comparatively large widths and cross sections of the current distribution structure 44 close to the connection surface 8 are required so that the shadowing of the active zone 22 is further increased. Compared to FIGS. 12A and 12B, a degree of coverage of the top side 25 with current distribution structures 44 can be reduced by about 50% in the examples of FIGS. 1A to 9.

Figure 13A:
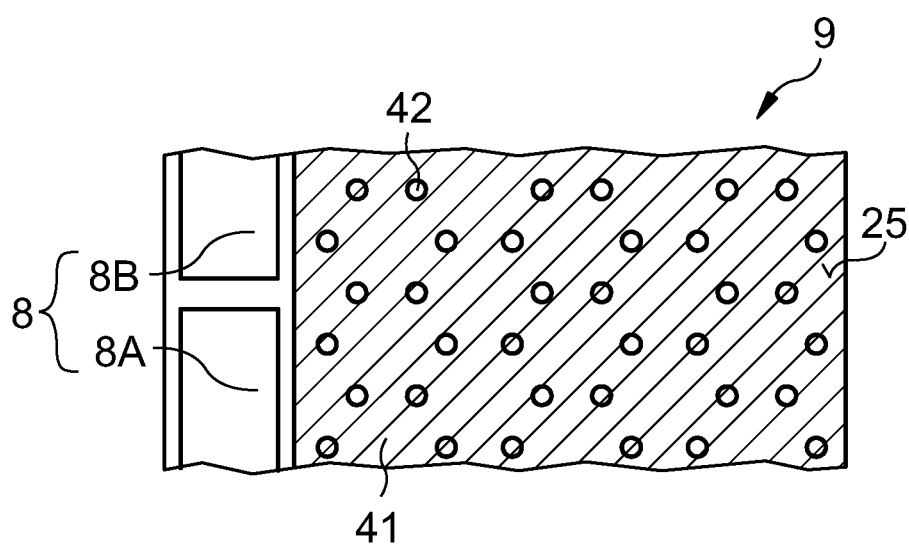
Figure 13B:
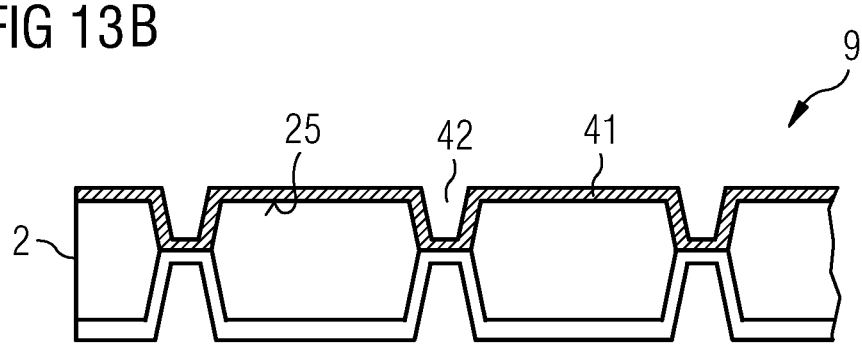

In the modification 9 of FIGS. 13A and 13B it is shown that, starting from the vias 42, the translucent current distribution layer 41 is present, but without current distribution structures. The current distribution layer 41 is preferably made of a TCO such as ITO. This makes the current distribution layer 41 comparatively thick, which leads to an increased absorption of the radiation in the current distribution layer 41. The metallic parts of the via 42 can still end within the semiconductor layer sequence 2 so that the top side 25 is free of metallic structures. In all other respects, the above remarks shall apply mutatis mutandis in particular to FIGS. 6 to 9.

Figure 14:
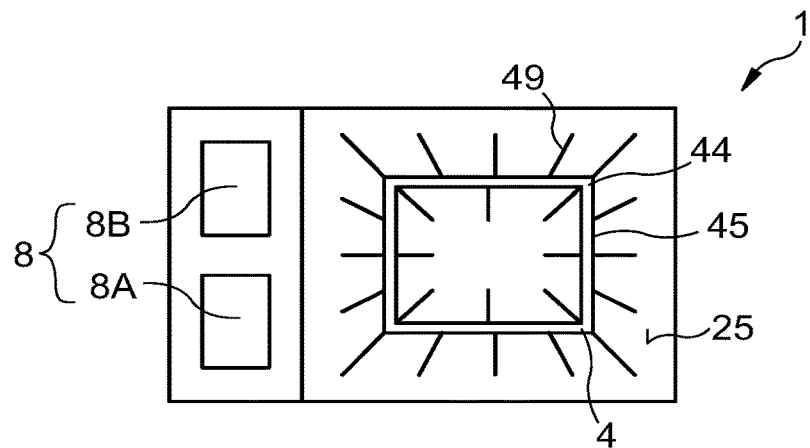

In the examples of FIG. 14, the vias 42 as well as the current distribution structure 44 are shaped as a continuous, e.g. rectangular frame when viewed from above. The vias 42 and the current distribution structure 44 may be congruent, preferably with the proviso that the current distribution structure 44 is wider than the vias 42. The vias 42 are located within the semiconductor layer sequence 2. For example, a portion of the semiconductor layer sequence 2 located within the frame-shaped vias 42 is at least 10% or 25% and/or at most 75% or 50% of a total area of the semiconductor layer sequence 2.

Optionally, the current distribution structure 44 can include, for example, linear branches 49. Sections of the branches 49 can run perpendicular to the via 42 or also radially outwards, e.g. starting from a geometric center of the semiconductor layer sequence 2.

Figure 15:
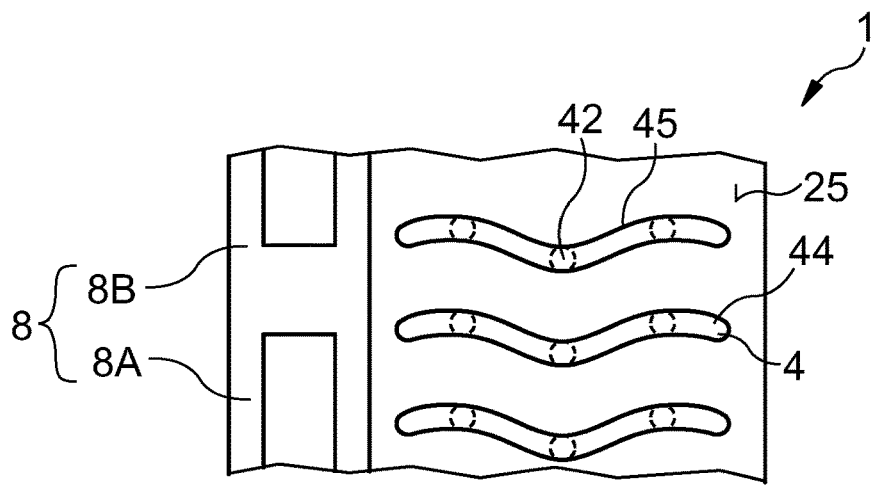

In the example of FIG. 15, the current distribution structures 44 are formed by serpentine, sinusoidal lines. For example, the vias 42 are located in maxima and minima of these sinusoidal lines or, in deviation from FIG. 15, in zero crossings. In all other respects, the explanations to FIGS. 3A and 3B shall apply mutatis mutandis to FIG. 15.

As in all other examples, it is possible that the current distribution structures 44 have rounded corners when viewed from above.

Figure 16:
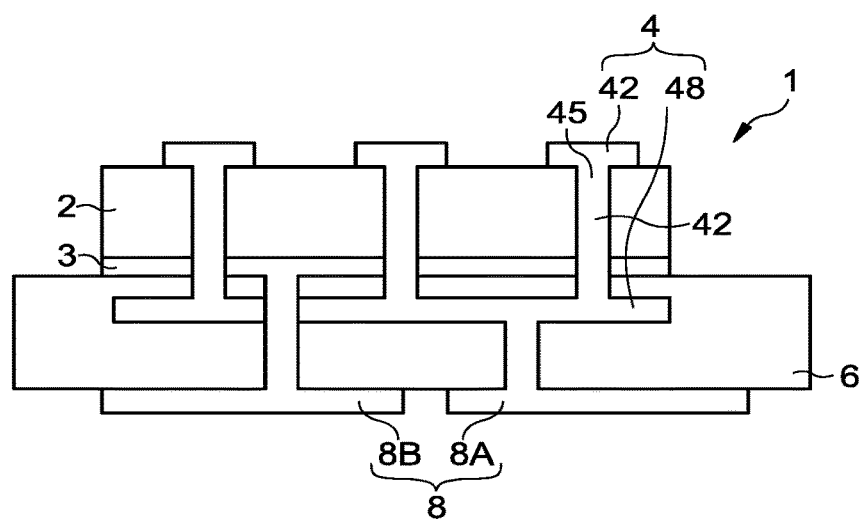

In the previous examples, the connection surfaces 8 are arranged approximately in a common plane with the first electrode 3. On the other hand, the connection surfaces 8 in FIG. 16 are located on a side of carrier 6 facing away from semiconductor layer sequence 2. The two electrodes 3, 4 electrically connect to the connection surfaces 8 through the carrier 6. This configuration can be transferred to the other examples accordingly.

Unless otherwise indicated, the components shown in the figures follow each other directly in the order indicated. Layers that do not touch each other in the figures are preferably spaced apart. As far as lines are drawn parallel to each other, corresponding surfaces preferably are also parallel to each other. Also, unless otherwise indicated, the relative positions of the drawn components to each other are correctly reproduced in the figures.

My devices are not limited by the description given in the examples. Rather, this disclosure includes any new feature and any combination of features, which in particular includes any combination of features in the appended claims, even if the feature or combination itself is not explicitly mentioned in the claims or examples.

This application claims priority of DE 10 2017 130 757.5, the subject matter of which is incorporated herein by reference.

What is claimed is:

1. An optoelectronic semiconductor device comprising
   a semiconductor layer sequence having an active zone that generates radiation,
   a first electrode that supplies current directly to a bottom side of the semiconductor layer sequence and is configured such that emission of the radiation occurs at a top side of the semiconductor layer sequence and not at the bottom side, and
   a second electrode that supplies current and extends from the bottom side to the top side opposite the bottom side,
   wherein the first electrode is electrically insulated from the second electrode,
   the second electrode comprises at least one current distribution structure on the top side,
   the current distribution structure is 1) impermeable to the generated radiation and electrically connected in a plurality of contact regions to at least one further component of the second electrode and configured for lateral current distribution starting from the contact regions, 2) a metallic structure with a thickness of 1 μm to 10 μm, and 3) arranged at the top of the semiconductor layer sequence only in regions, the second electrode comprises as a further component a plurality of vias through the first electrode and through the semiconductor layer sequence, the vias, viewed in plan view of the top side, are surrounded all around by a material of the semiconductor layer sequence and electrically directly connect to the at least one current distribution structure in the contact regions, the vias, viewed in cross section, narrow from the bottom side as well as from the top side towards a center of the semiconductor layer sequence, and the vias are hollow directly at the bottom side and at the top side and are closed in the center.

2. A light-emitting diode comprising the optoelectronic semiconductor device according to claim 1, wherein the semiconductor layer sequence is based on the material system AlGaInAsP, the first electrode is a mirror, and the second electrode comprises a flat current spreading layer on a side remote from the semiconductor layer sequence.

3. The optoelectronic semiconductor device according to claim 1, wherein a plurality or all of said vias directly electrically connect to each other by the current distribution structure or by the current distribution structures.

4. The optoelectronic semiconductor device according to claim 3, comprising exactly one current distribution structure, wherein the current distribution structure electrically connects the vias to one another in a rectangular or hexagonal grid when viewed in plan view.

5. The optoelectronic semiconductor device according to claim 1, wherein each of the vias is associated with its own current distribution structure.

6. The optoelectronic semiconductor device according to claim 1, wherein the vias, seen in plan view, each have an average diameter of at least 0.5 μm and of at most 8 μm, and an average distance between adjacent vias is 15 μm to 200 μm.

7. The optoelectronic semiconductor device according to claim 1, wherein the vias are completely covered by the at least one current distribution structure or lie completely within said at least one current distribution structure as seen in plan view of the top side.

8. The optoelectronic semiconductor device according to claim 1, wherein a maximum distance between adjacent contact regions and/or between adjacent current distribution structures is at most 100 μm so that no point at the top side of the semiconductor layer sequence is more than 50 μm apart from the at least one current distribution structure.

* * * * *